US012804857B2

(12) United States Patent
Zeng et al.

(10) Patent No.: US 12,804,857 B2
(45) Date of Patent: Nov. 17, 2026

(54) SERVER

(71) Applicants: SQ TECHNOLOGY (SHANGHAI) CORPORATION, Shanghai (CN); INVENTEC CORPORATION, Taipei (TW)

(72) Inventors: Boheng Zeng, Shanghai (CN); Xiaogang Lu, Shanghai (CN); Kangguang Zhu, Shanghai (CN); Jiangjun Wu, Shanghai (CN); Hong-Chou Lin, Taipei (TW); Yu-Fan Chen, Taipei (TW)

(73) Assignees: SQ TECHNOLOGY (SHANGHAI) CORPORATION, Shanghai (CN); INVENTEC CORPORATION, Taipei (TW)

(*) Notice: Subject to any disclaimer, the term of this patent is extended or adjusted under 35 U.S.C. 154(b) by 239 days.

(21) Appl. No.: 18/748,077

(22) Filed: Jun. 19, 2024

(65) Prior Publication Data

US 2025/0358974 A1 Nov. 20, 2025

(30) Foreign Application Priority Data

May 15, 2024 (CN) ........................ 202410607212.X

(51) Int. Cl.
*H05K 7/20* (2006.01)

(52) U.S. Cl.
CPC ..... *H05K 7/20772* (2013.01); *H05K 7/20254* (2013.01)

(58) Field of Classification Search
CPC ........................ H05K 7/20772; H05K 7/20254
USPC ...................................................... 361/679.53
See application file for complete search history.

(56) References Cited

U.S. PATENT DOCUMENTS

| | | | | |
|---|---|---|---|---|
| 6,942,018 | B2 * | 9/2005 | Goodson | H10W 40/47 174/15.1 |
| 7,120,021 | B2 * | 10/2006 | Hamman | F28D 15/00 174/15.1 |
| 7,400,505 | B2 * | 7/2008 | Campbell | H05K 7/20772 174/15.1 |
| 7,466,553 | B2 * | 12/2008 | Hamman | G06F 1/20 62/3.2 |
| 7,751,918 | B2 * | 7/2010 | Campbell | H05K 7/20809 361/676 |
| 7,957,132 | B2 * | 6/2011 | Fried | H05K 7/20809 361/694 |
| 8,422,218 | B2 * | 4/2013 | Fried | H05K 7/20809 361/695 |
| 9,144,179 | B2 * | 9/2015 | Shelnutt | H05K 7/20809 |
| 11,589,476 | B2 * | 2/2023 | Ma | H05K 7/20236 |

(Continued)

*Primary Examiner* — Anatoly Vortman

(57) ABSTRACT

A server includes a first chassis, a second chassis, a primary heat generation component, and a secondary heat generation component. The first chassis has a first containment chamber, and the primary heat generation component is arranged within the first containment chamber. The first chassis also has a first liquid inlet and a first liquid outlet which are both in communication with the first containment chamber. The second chassis is arranged at one end of the first chassis and has a second containment chamber. The second containment chamber is sealed and isolated from the first containment chamber. The secondary generation component is arranged in the second containment chamber.

15 Claims, 4 Drawing Sheets

(56) References Cited

U.S. PATENT DOCUMENTS

| | | | | |
|---|---|---|---|---|
| 11,622,471 | B2 * | 4/2023 | Chen | H05K 7/20254<br>361/679.53 |
| 12,123,652 | B2 * | 10/2024 | Wu | F28D 1/024 |
| 2009/0260777 | A1 * | 10/2009 | Attlesey | G06F 1/20<br>165/104.33 |
| 2011/0134604 | A1 * | 6/2011 | Attlesey | G06F 1/20<br>361/679.53 |
| 2018/0027695 | A1 * | 1/2018 | Wakino | H05K 7/20772<br>361/699 |
| 2022/0095481 | A1 * | 3/2022 | Ma | H05K 7/20236 |
| 2022/0408589 | A1 * | 12/2022 | Ji | F28D 1/035 |
| 2023/0156956 | A1 * | 5/2023 | Hsieh | G06F 1/206<br>62/177 |

* cited by examiner

SERVER

CROSS-REFERENCE TO RELATED DISCLOSURES

This application claims priority to Chinese patent application No. 202410607212.X filed with the Chinese Patent Office on May 15, 2024, entitled "SERVER", the entire content of which is incorporated by reference.

TECHNICAL FILED

The present disclosure relates to the field of server technology, particularly to a server.

BACKGROUND

With the development of technologies such as the Internet of Things and 5G, the speed and scale of data generation continue to increase, leading to an increasing demand for real-time processing and analysis of data. Servers, as hardware devices for processing and analyzing data, generate a large amount of heat during operation. To ensure the performance of servers, cooling systems are required to dissipate the heat for the servers.

Servers are often cooled using a liquid cooling method. During operation, the server is placed in a container filled with cooling liquid. The cooling liquid enters the server through an inlet to cool the heat generation components in the server. When the server needs maintenance, it is lifted out of the container to drain. During the lifting and draining process, there may be splashing of the cooling liquid, which causes loss. Additionally, if the cooling liquid in the container needs to be replaced, all servers in the container must be lifted out, making the replacement process cumbersome.

SUMMARY

A server is provided, which includes a first chassis, a primary heat generation component, a second chassis, and a secondary heat generation component. The first chassis has a first containment chamber containing cooling liquid. The primary heat generation component is arranged within the first containment chamber, the first chassis has a first liquid inlet and a first liquid outlet which are both in communication with the first containment chamber, and the first chassis has a first end. The second chassis is arranged at the first end and fixedly connected to the first chassis. The second chassis has a second containment chamber, the second containment chamber is sealed and isolated from the first containment chamber. The secondary generation component is arranged in the second containment chamber.

In an embodiment, the primary heat generation component includes a motherboard arranged at a lower part of the first chassis in a first direction, where the first direction is a height direction of the first chassis. The server further includes a first liquid cooling module arranged on a surface of the motherboard. The first liquid cooling module has a second liquid inlet and a second liquid outlet in communication with the second liquid inlet. The second liquid inlet is in communication with the first liquid inlet. The second liquid outlet is in communication with the first containment chamber.

In an embodiment, the motherboard is provided with a CPU. The first liquid cooling module includes a first cold plate corresponding to a position of the CPU. The first cold plate includes the second liquid inlet and the second liquid outlet.

In an embodiment, the primary heat generation component further includes a GPU module arranged at a lower part of the first chassis in the first direction and located on a side of the motherboard away from the first end.

In an embodiment, the GPU module has a receiving cavity. The server further includes a second liquid cooling module. The second liquid cooling module includes a third cold plate arranged within the receiving cavity. The third cold plate has a third liquid inlet and a third liquid outlet in communication with the third liquid inlet. The third liquid inlet is in communication with the first liquid inlet. The third liquid outlet is in communication with the receiving cavity. The GPU module further has a fourth liquid outlet in communication with the receiving cavity and the first containment chamber.

In an embodiment, the server further includes a liquid divider fixed on the first chassis. The liquid divider has a liquid dividing chamber, a first liquid dividing inlet, a second liquid dividing inlet, and a third liquid dividing inlet. The liquid dividing chamber is in communication with the first liquid dividing inlet, the second liquid dividing inlet and the third liquid dividing inlet. The first liquid dividing inlet is in communication with the first liquid inlet, the second liquid dividing inlet is in communication with the second liquid inlet, and the third liquid dividing inlet is in communication with the third liquid inlet.

In an embodiment, the server further includes a first temperature sensor arranged within the liquid divider, and the first temperature sensor is configured to detect a temperature of the cooling liquid in the liquid divider.

In an embodiment, the method further includes an OCP module arranged above the GPU module in the first direction.

In an embodiment, the OCP module has a top and a bottom in the first direction. The server further includes a first liquid level sensor arranged in the first containment chamber. The first liquid level sensor has a first sensing end. The first liquid level sensor is positioned at a height between the top and the bottom of the OCP module.

In an embodiment, the server further includes a second liquid level sensor arranged in the first containment chamber. The second liquid level sensor is positioned higher than the first liquid level sensor. The second liquid level sensor has a second sensing end located above the primary heat generation component, and the second sensing end is spaced from a top of the first chassis.

In an embodiment, the first chassis further has a second end opposite to the first end.

In an embodiment, the first liquid inlet and the first liquid outlet are arranged at the second end, and the first liquid outlet is arranged above the first liquid inlet in the first direction.

In an embodiment, the second end is provided with a through hole. The server further includes an electrical connector mounted on the first chassis. The electrical connector includes a seat body and a first clamping portion coupled to the seat body. The seat body is arranged within the first containment chamber. The first clamping portion is arranged outside the second end via the through hole and configured to be electrically connected to a power supply device. The server further includes a power supply board and a power supply cable. The power supply board is arranged above the motherboard and electrically connected to the motherboard. One end of the power supply cable is electrically connected to the power supply board, and the other end of the power supply cable is electrically connected to the electrical connector.

In an embodiment, the power supply board includes a power converter electrically connected to the power supply cable. The server further includes a power adapter plate arranged above the motherboard in the first direction and arranged on a side of the power supply board facing the second end. The power adapter plate is electrically connected to the power converter and the motherboard.

In an embodiment, the first chassis further has a second end opposite to the first end. The first chassis includes a casing and a lid. The casing has an opening on one side thereof. The opening is located between the first end and the second end. The lid is arranged at the opening. The casing has a receiving groove at the side where the opening is located. A sealing member is arranged within the receiving groove, and the lid is sealingly engaged with the casing through the sealing member.

In an embodiment, the side of the casing where the opening is located has multiple first fixing holes, all of which are arranged along a circumference of the opening at intervals and located on the outside of the sealing member. The lid has second fixing holes, all of which are arranged along a circumference of the lid at intervals. Fixing members are provided within the first fixing holes and the second fixing holes, respectively.

BRIEF DESCRIPTION OF THE DRAWINGS

In order to illustrate the technical solutions in the embodiments of the present disclosure or prior art more clearly, the accompanying drawings used in the description of the embodiments or prior art will be briefly introduced below. Apparently, the accompanying drawings in the following description are only some embodiments of the present disclosure. For those of ordinary skill in the art, other drawings can also be derived from these drawings without creative effort.

DETAILED DESCRIPTION

In order to make the above purposes, features, and advantages of the present disclosure more clearly understood, the specific embodiments of the present disclosure are described in detail below in conjunction with the drawings. Many specific details are described for fully understanding the present disclosure. However, the present disclosure can be implemented in many ways different from those described here, and those skilled in the art can make similar improvements without departing from the essence of the present disclosure, so the present disclosure is not limited to the specific embodiments disclosed below.

Figure 1:
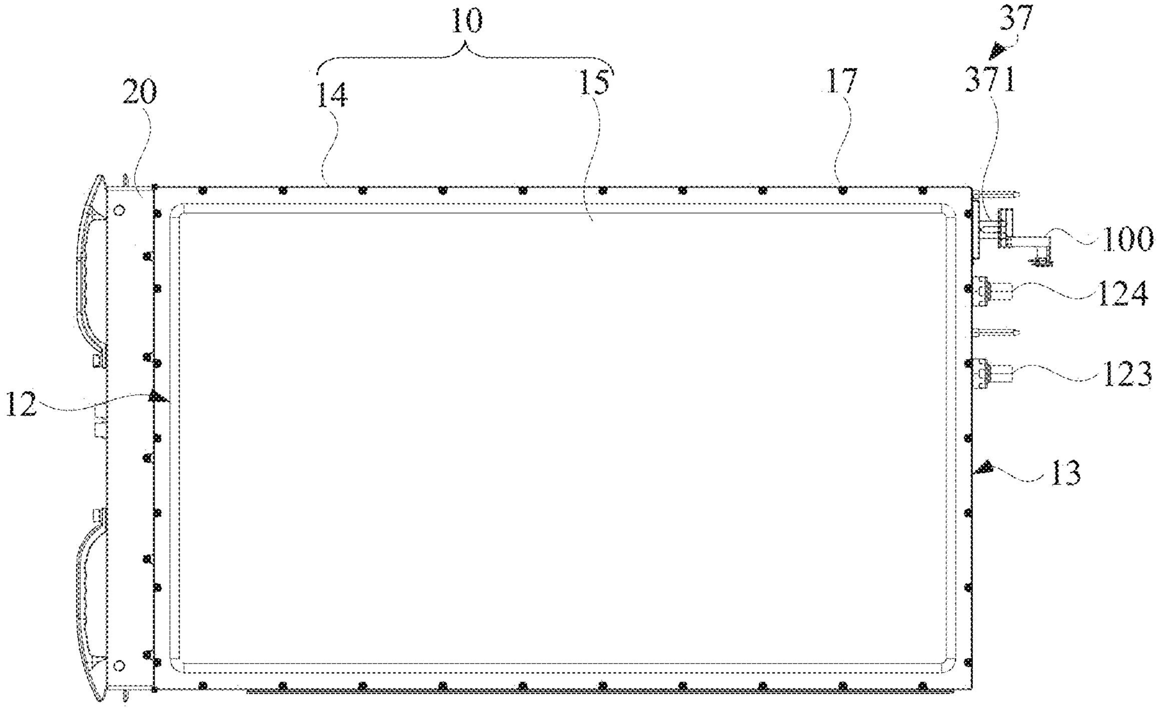
FIG. 1 is a front view of a server according to an embodiment of the present disclosure.
Figure 3:
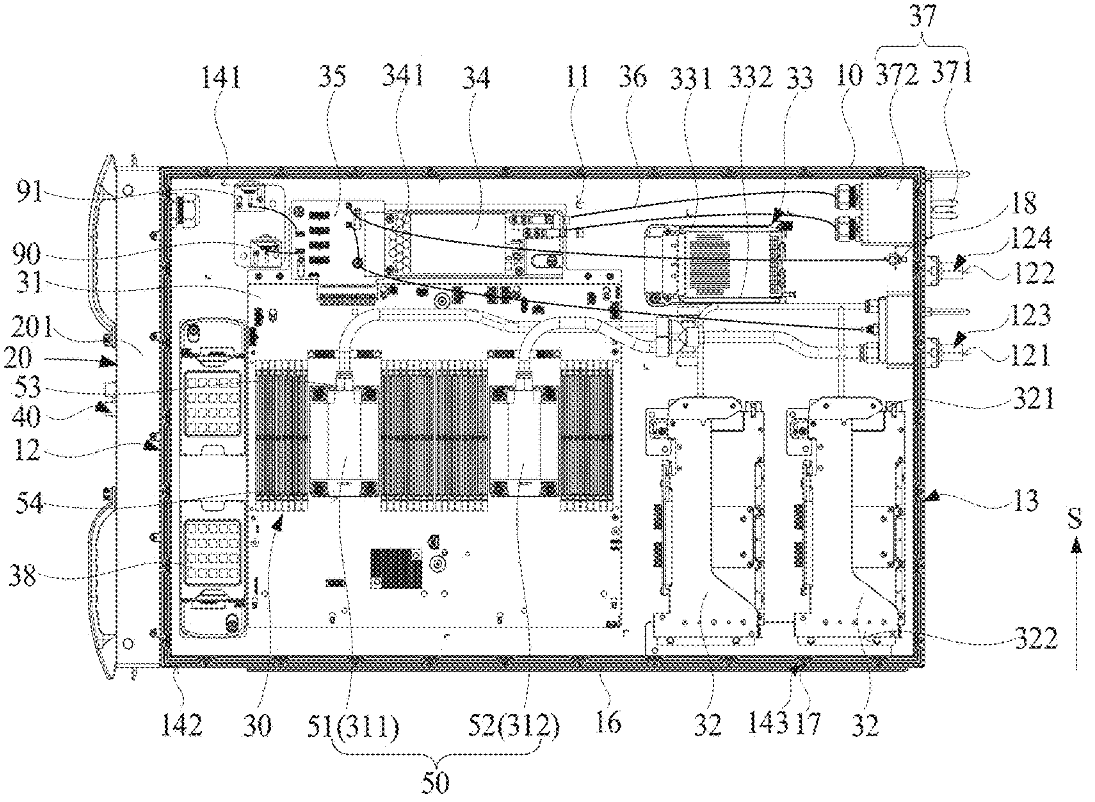
FIG. 3 is a schematic diagram of an internal structure of the server in FIG. 1.

Referring to FIG. 1 and FIG. 3, a server provided in an embodiment of the present disclosure includes a first chassis 10 and primary heat generation components 30. The first chassis 10 has a first containment chamber 11 which contains cooling liquid. The primary heat generation components 30 are arranged in the first containment chamber 11. The first chassis 10 also has a first liquid inlet 121 and a first liquid outlet 122, both of which are in communication with the first containment chamber 11. The cooling liquid can flow into the first containment chamber 11 through the first liquid inlet 121 to immerse the primary heat generation components 30, and the cooling liquid after heat exchange can be discharged from the first liquid outlet 122.

Optionally, the cooling liquid can be mineral oil or modified silicone oil. Using modified silicone oil as the cooling medium can reduce costs.

Optionally, the primary heat generation components 30 include calculation modules for calculation, including a motherboard 31, and CPUs and GPU modules 32 arranged on the motherboard 31. It can be understood that the number of the primary heat generation components may be one or more, without specific limitations in the embodiments of the present disclosure.

Figure 2:
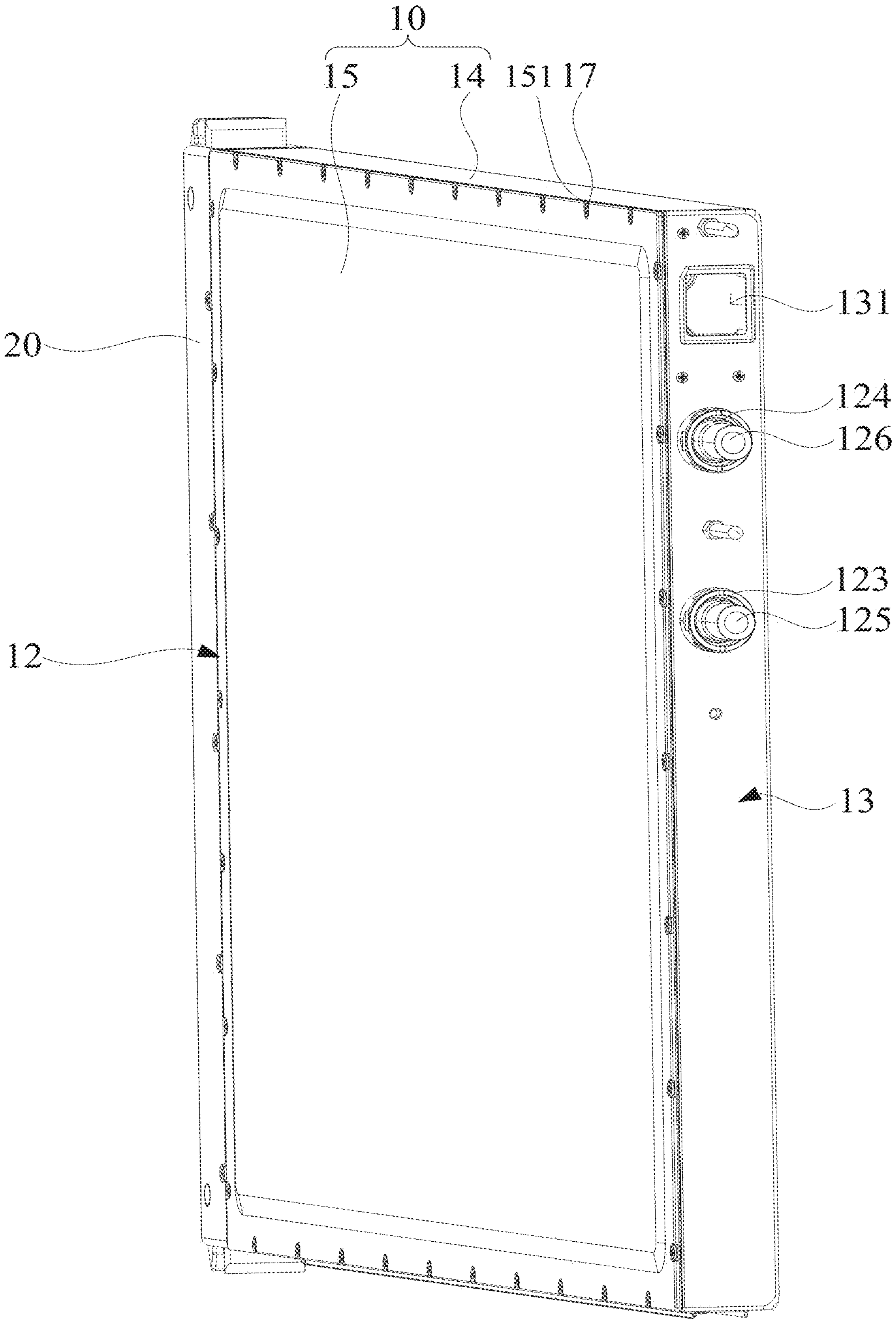
FIG. 2 is a schematic diagram of a structure of the server in FIG. 1 from another perspective.

Furthermore, referring to FIG. 2, the first chassis 10 has a first mounting hole within which a liquid inlet blind plug 123 is mounted. The liquid inlet blind plug 123 is in communication with a liquid supply device. Specifically, the liquid inlet blind plug 123 includes the first liquid inlet 121, and the first liquid inlet 121 is provided with a first elastic flap 125. When cooling liquid is injected into the first containment chamber 11, the first flap 125 is pushed inward to open the first liquid inlet 121, allowing the cooling liquid to flow into the first containment chamber 11. When the server is taken out for maintenance, the first elastic flap 125 pops out to close the first liquid inlet 121, preventing cooling liquid from leaking out of the first containment chamber 11 through the first liquid inlet 121.

Furthermore, referring to FIG. 2, the first chassis 10 has a second mounting hole within which a liquid outlet blind plug 124 is mounted. The liquid outlet blind plug 124 is in communication with a CDU (cooling liquid distribution unit). Specifically, the liquid outlet blind plug 124 includes the first liquid outlet 122, and the first liquid outlet 122 is provided with a second elastic flap 126. When cooling liquid is discharged from the first containment chamber 11, the second elastic flap 126 is pushed inward to open the first liquid outlet 122, allowing the cooling liquid to flow out through the first liquid outlet 122. When the server is taken out for maintenance, the second elastic flap 126 pops out to close the first liquid outlet 122, preventing cooling liquid from leaking out of the first containment chamber 11 through the first liquid outlet 122. During the operation of the server, the primary heat generation components 30 generate a large amount of heat. To dissipate heat from the primary heat generation components 30, the liquid supply device provides cooling liquid, which flows into the first containment chamber 11 through the first liquid inlet 121. The cooling liquid exchanges heat with the primary heat generation components 30 to reduce the temperatures of the primary heat generation components 30. The cooling liquid after heat exchange is then discharged from the first liquid outlet 122 to the CDU, and the CDU exchanges heat with the cooling liquid.

In an embodiment, referring to FIG. 1 and FIG. 3, the first chassis 10 includes a first end 12 and a second end 13 opposite to the first end 12. The server also includes a second chassis 20 and secondary heat generation components 40. The second chassis 20 is arranged at the first end 12 of the first chassis 10 and fixedly connected to the first chassis 10.

The second chassis 20 has a second containment chamber 201 which is sealed and isolated from the first containment chamber 11, and the secondary heat generation components 40 are arranged in the second containment chamber 201.

Optionally, the secondary heat generation components 40 include I/O modules that do not participate in calculations. As the I/O modules generate less heat, it does not require immersion liquid cooling for heat dissipation of the secondary heat generation components 40. It can be understood that the number of the secondary heat generation components may be one or more, without specific limitations in the embodiments of the present disclosure.

According to the amount of heat generated, the components in the server are divided into primary heat generation components 30 and secondary heat generation components 40. Due to the large amount of heat generated, the primary heat generation components 30 are arranged in the first containment chamber 11 and cooled by immersion liquid cooling. The secondary heat generation components 40 generate less heat and do not require immersion liquid cooling for heat dissipation, so the secondary heat generation components 40 are arranged in the second containment chamber 201 sealed and isolated from the first containment chamber 11. As such, the cooling liquid is provided only in the first containment chamber 11, which ensures heat dissipation, while reducing the amount of cooling liquid used and lowering the costs.

When the server needs maintenance, the cooling liquid in the first containment chamber 11 can flow out through the first liquid outlet 122. After all the cooling liquid has flowed out, the server can be maintained without the need to lift and drain the server, avoiding losses such as splashing of the cooling liquid. When the server needs to replace the cooling liquid, the cooling liquid in the first containment chamber 11 flows out through the first liquid outlet 122. After all the cooling liquid has flowed out, new cooling liquid is injected into the first containment chamber 11 through the first liquid inlet 121. As such, the cooling liquid replacement process is completed, without the step of lifting all servers, which improves the efficiency of cooling liquid replacement.

In an embodiment, referring to FIG. 3, the primary heat generation component 30 includes a motherboard 31 located at a lower part of the first chassis 10 in a first direction S. It is noted that the first direction S is the height direction of the first chassis 10, and S denotes the first direction.

Figure 4:
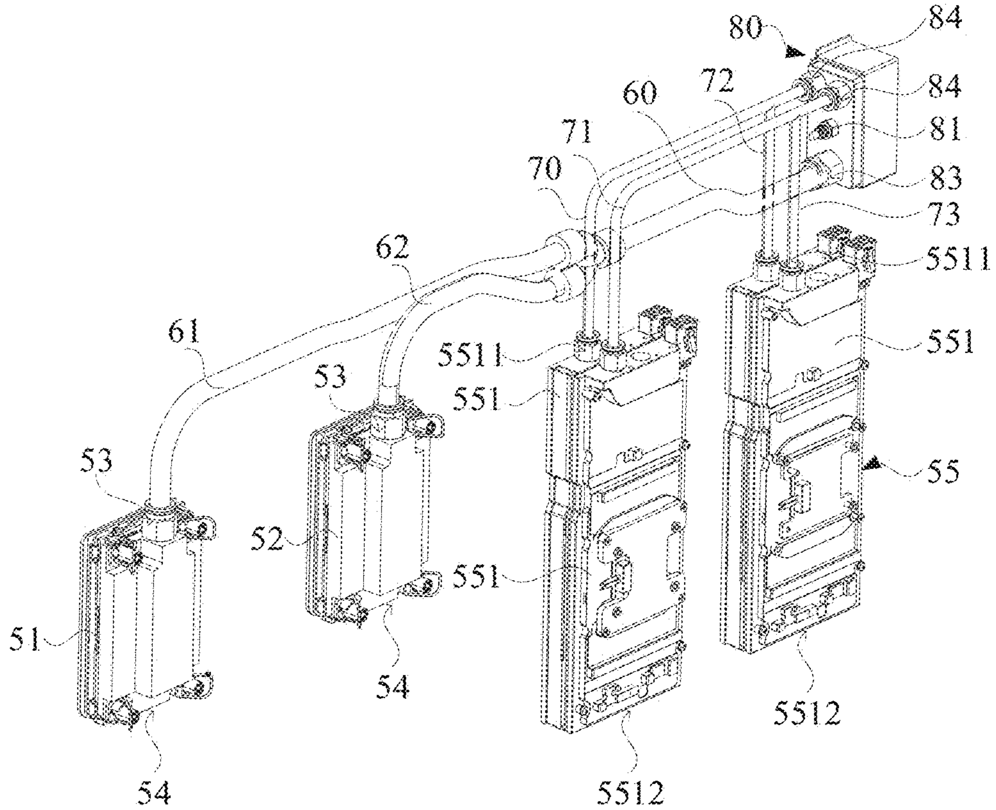
FIG. 4 is a schematic diagram of a structure of a first liquid cooling module and a second liquid cooling module of the server in FIG. 1.

Furthermore, referring to FIG. 3, the server also includes a first liquid cooling module 50 arranged on a surface of the motherboard 31. Referring to FIG. 4, the first liquid cooling module 50 has a second liquid inlet 53 and a second liquid outlet 54 in communication with the second liquid inlet 53. The second liquid inlet 53 is in commutation with the first liquid inlet 121, and the second liquid outlet 54 is in communication with the first containment chamber 11. When the server is operating, the motherboard 31 generates a large amount of heat, and the first liquid cooling module 50 dissipates the heat from the motherboard 31. Specifically, the cooling liquid flows into the first liquid cooling module 50 through the first liquid inlet 121 and the second liquid inlet 53. As the first liquid cooling module 50 is in contact with the motherboard 31, it can exchange heat with the motherboard 31 to reduce the temperature of the motherboard 31. The cooling liquid after heat exchange is then discharged from the second liquid outlet 54 into the first containment chamber 11. The cooling liquid reaches a specific height in the first containment chamber 11 to immerse the primary heat generation components 30. The cooling liquid exchanges heat with the primary heat generation components 30 to lower the temperatures of the primary heat generation components 30, and the cooling liquid after heat exchange is discharged from the first liquid outlet 122.

The motherboard 31 generates a large amount of heat, and excessive heat accumulation on motherboard 31 will have adverse impacts on the motherboard 31, thereby affecting the performance of the server. Therefore, in the present embodiment, the cooling liquid first dissipates heat from the motherboard 31, and then flows into the first containment chamber 11 to dissipate heat from other primary heat generation components 30, thereby achieving a good cooling effect.

Furthermore, referring to FIG. 3, a first CPU 311 and a second CPU 312 are arranged on the motherboard 31. The first liquid cooling module 50 includes a first cold plate 51 and a second cold plate 52, with the first cold plate 51 corresponding to the position of the first CPU 311 and the second cold plate 52 corresponding to the position of the second CPU 312. Referring to FIG. 4, the first cold plate 51 and the second cold plate 52 each include the second liquid inlet 53 and the second liquid outlet 54. As such, by using the first cold plate 51 and the second cold plate 52 to cool the first CPU 311 and the second CPU 312 respectively, it is beneficial to improve the heat dissipation efficiency and effect of the first CPU 311 and the second CPU 312.

It should be understood that in other embodiments, the number of CPUs may be one or three or more, and correspondingly, there is provided one or three or more first cold plates 51.

Specifically, referring to FIG. 3 and FIG. 4, the first liquid cooling module 50 also includes a first main liquid inlet pipe 60, a first branch liquid inlet pipe 61, and a second branch liquid inlet pipe 62. One end of the first main liquid inlet pipe 60 is in communication with the first liquid inlet 121, and the other end of the first main liquid inlet pipe 60 has a connector 63. The connector 63 has a first communication port and a second communication port. One end of the first branch liquid inlet pipe 61 is in communication with the first communication port, and the other end of the first branch liquid inlet pipe 61 is in communication with the second liquid inlet 53 of the first cold plate 51. One end of the second branch liquid inlet pipe 62 is in communication with the second communication port, and the other end of the second branch liquid inlet pipe 62 is in communication with the second liquid inlet 53 of the second cold plate 52. As such, by using the first main liquid inlet pipe 60, the first branch liquid inlet pipe 61, and the second branch liquid inlet pipe 62, communication between the first liquid inlet 121 and the second liquid inlets 53 of the first cold plate 51 and the second cold plate 52 is achieved.

In an embodiment, referring to FIG. 3, the primary heat generation component 30 also includes an NVMe device 38 (Non-Volatile Memory Host Controller Interface Specification, computer interface). The NVMe device 38 is arranged at a lower part of the first chassis 10 in the first direction S, and is positioned between the first end 12 and one side of the motherboard 31 facing the first end 12. As such, the NVMe device 38 is reasonably arranged, making the server structure compact and reducing the volume of the server.

It should be noted that the number of the NVMe device 38 can be set according to actual needs, without specific limitation thereto. In the present embodiment, referring to FIG. 3, there are two NVMe devices 38 arranged in the height direction of the first chassis 10 at a lower part of the first chassis 10 in the first direction S.

In an embodiment, referring to FIG. 3, the primary heat generation components 30 also include GPU modules 32. Optionally, the GPU modules 32 are arranged at a lower part of the first chassis 10 in the first direction S and positioned between one end of the motherboard 31 facing the second end 13 and the second end 13.

In an embodiment, referring to FIG. 3, the GPU module 32 has a receiving cavity 321. Referring to FIG. 4, the server also includes a second liquid cooling module 55. The second liquid cooling module 55 includes a third cold plate 551 arranged within the receiving cavity 321. The third cold plate 551 has a third liquid inlet 5511 and a third liquid outlet 5512 in communication with the third liquid inlet 5511. The third liquid inlet 5511 is in communication with the first liquid inlet 121, and the third liquid outlet 5512 is in communication with the receiving cavity 321. The GPU module 32 also includes a fourth liquid outlet 322 in communication with the receiving cavity 321 and the first containment chamber 11.

When the server is operating, the GPU module 32 generates a large amount of heat and transfers the heat to the third cold plate 551. Cooling liquid flows into the third cold plate 551 through the first liquid inlet 121 and the third liquid inlet 5511, and exchanges heat with the third cold plate 551 to reduce the temperature of the cold plate 551, thereby lowering the temperature of the GPU module 32. The cooling liquid after heat exchange flows into the receiving cavity 321 through the third liquid outlet 5512, and then flows into the first containment chamber 11 through the fourth liquid outlet 322. The cooling liquid reaches a specific height in the first containment chamber 11 to immerse the primary heat generation components 30. The cooling liquid exchanges heat with the GPU modules 32 to lower the temperatures of the primary heat generation components 30, and the cooling liquid after heat exchange is discharged from the first liquid outlet 122.

Liquid cooling is performed for the CPUs and the GPU modules 32, which meets the cooling needs of the CPUs and the GPU modules 32 in the server, improves the cooling efficiency of the server, and ensures the safe operation of the server.

It should be noted that the number of GPU modules 32 can be set according to actual needs, without specific limitations thereto. For example, the number of GPU modules 32 can be one, two, three, or more.

In the present embodiment, there are four GPU modules 32. The four GPU modules 32 are arranged side by side in pairs between the motherboard 31 and the second end 13. Furthermore, referring to FIG. 3 and FIG. 4, the second liquid cooling module 55 also includes a second main liquid inlet pipe 70, a third main liquid inlet pipe 71, a third branch liquid inlet pipe 72, and a fourth branch liquid inlet pipe 73. One end of the second main liquid inlet pipe 70 is in communication with the first liquid inlet 121, and the other end of the second main liquid inlet pipe 70 is in communication with the third liquid inlet 5511 of the third cold plate 551 in one of the GPU modules 32 in pair. One end of the third branch liquid inlet pipe 72 is in communication with the second main liquid inlet pipe 70, and the other end of the third branch liquid inlet pipe 72 is in communication with the third liquid inlet 5511 of the third cold plate 551 in the other GPU module 32 in the pair. One end of the third main liquid inlet pipe 71 is in communication with the first liquid inlet 121, and the other end of the third main liquid inlet pipe 71 is in communication with the third liquid inlet 5511 of the third cold plate 551 in one of the GPU modules 32 in the other pair. One end of the fourth branch liquid inlet pipe 73 is in communication with the third main liquid inlet pipe 71, and the other end of the fourth branch liquid inlet pipe 73 is in communication with the third liquid inlet 5511 of the third cold plate 551 in the other GPU module 32 in the other pair.

Figure 5:
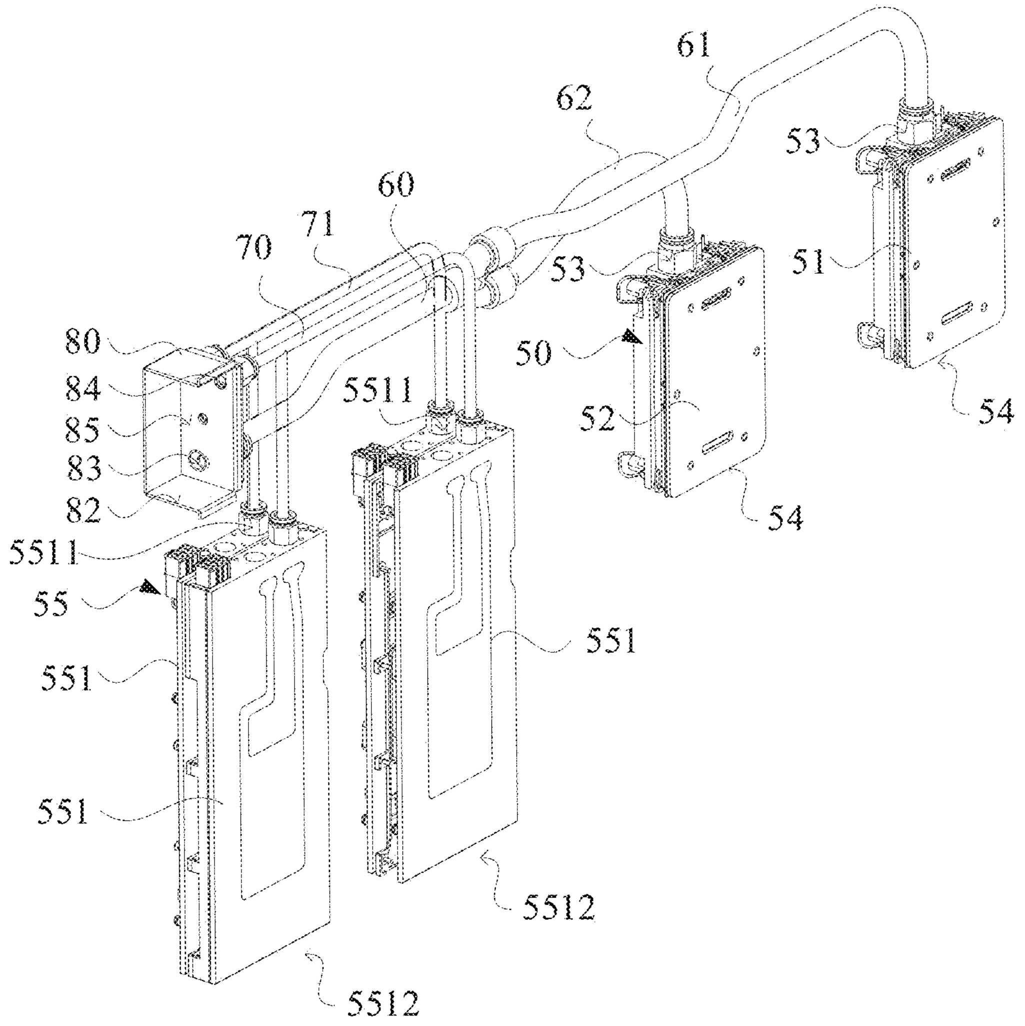
FIG. 5 is a schematic diagram of the structure of the first liquid cooling module and the second liquid cooling module in FIG. 4 from another perspective.

In an embodiment, referring to FIG. 3 and FIG. 4, the server also includes a liquid divider 80 arranged within the first containment chamber 11. Specifically, the liquid divider 80 is fixed on the second end 13. Referring to FIG. 4 and FIG. 5, the liquid divider 80 has a liquid dividing chamber 85, a first liquid dividing inlet 82, a second liquid dividing inlet 83, and a third liquid dividing inlet 84. The dividing chamber 85 is in communication with the first liquid dividing inlet 82, the second liquid dividing inlet 83, and the third liquid dividing inlet 84. The first liquid dividing inlet 82 is in communication with the first liquid inlet 121, the second liquid dividing inlet 83 is in communication with the second liquid inlets 53, and the third liquid dividing inlet 84 is in communication with the third liquid inlets 5511. When the server is operating, the cooling liquid enters the liquid dividing chamber 85 through the first liquid inlet 121 and the first liquid dividing inlet 82, and the cooling liquid in the liquid dividing chamber 85 flows into the first liquid cooling module 50 through the second liquid dividing inlet 83 and the second liquid inlets 53 to dissipate heat from the CPU. The cooling liquid in the liquid dividing chamber 85 flows into the second liquid cooling module 55 through the third liquid dividing inlet 84 and the third liquid inlets 5511 to dissipate heat from the GPU modules 32.

Specifically, referring to FIG. 4, the second liquid dividing inlet 83 is provided with one, one end of the first main liquid inlet pipe 60 away from the first liquid cooling module 50 is in communication with the second liquid dividing inlet 83. The third liquid dividing inlet 84 is provided with two. One end of the second main liquid inlet pipe 70 away from the second liquid cooling module 55 is in communication with one of the third liquid dividing inlets 84, and one end of the third main liquid inlet pipe 71 away from the second liquid cooling module 55 is in communication with the other third liquid dividing inlet 84.

In an embodiment, referring to FIG. 4, the server also includes a first temperature sensor 81 arranged within the liquid divider 80 and configured to detect the temperature of the cooling liquid in the liquid divider 80. The first temperature sensor 81 can thus detect the inlet temperature in real time such that the inlet temperature can be regulated accordingly.

In an embodiment, referring to FIG. 3, the server also includes a second temperature sensor 18 arranged within the first containment chamber 11, and the second temperature sensor 18 is mounted on the first chassis 10 and arranged near the first liquid outlet 122. The second temperature sensor 18 is configured to detect the temperature of the cooling liquid flowing out through the first liquid outlet 122. As such, users can have the real-time temperature of the cooling liquid flowing out through the first liquid outlet 122.

In an embodiment, the server adopts the internationally common OCP-Rack-V3 power supply form.

Specifically, referring to FIG. 2, the second end 13 of the first chassis 10 has a through hole 131. The server also includes an electrical connector 37 mounted on the first chassis 10. Referring to FIG. 3, the electrical connector 37 includes a seat body 372 and a first clamping portion 371 coupled to the seat body 372. The seat body 372 is located inside the first containment chamber 11, and the first clamping portion 371 is arranged outside the second end 13 through the through hole 131. The first clamping portion 371 is configured to be electrically connected to the power supply device 100 fixed on a cabinet.

Furthermore, referring to FIG. 3, the server also includes a power supply board 34 and a power supply cable 36. The power supply board 34 is located above the motherboard 31 in the first direction S, and is electrically connected to the motherboard 31. One end of the power supply cable 36 is connected to the power supply board 34, and the other end of the power supply cable 36 is connected to the electrical connector 37. In use, the first clamping portion 371 is electrically connected to the power supply device 100, and the power supply cable 36 supplies power to the motherboard 31, enabling the motherboard 31 to operate. Additionally, by arranging the power supply board 34 above the motherboard 31 in the first direction S, it reasonably utilizes the internal space of the first chassis 10, resulting in a compact structure of the server and reducing the server's volume.

Furthermore, referring to FIG. 3, the power supply board 34 includes a power converter 341 electrically connected to the power supply cable 36. Optionally, the power converter 341 can convert a 48V voltage to a 12V voltage. The server also includes a power adapter board 35 arranged above the motherboard 31 in the first direction S and positioned on one side of the power supply board 34 facing the second end 13. The power adapter board 35 is electrically connected to the power converter 341 and the motherboard 31. During operation, the power supply device 100 provides a 48V voltage, which is transmitted to the power converter 341 via the power supply cable 36 to convert it to a 12V voltage. The 12V voltage is then transmitted to the power adapter board 35 through gold fingers on the power converter 341, and further transmitted to the motherboard 31 through gold fingers on the power adapter board 35, allowing the motherboard 31 to operate.

In an embodiment, referring to FIG. 3, the server also includes an OCP module 33 arranged above the GPU modules 32 in the first direction S. The GPU module is vertically mounted at a lower part of the first chassis 10 in the first direction S, with a certain gap between the top of the GPU module 32 and the top of the first chassis 10 to accommodate the OCP module 33 between the GPU module and the top of the first chassis 10. By reasonably arranging the OCP module 33, the server's structure is compact, which is conducive to reducing the volume of the server.

In an embodiment, referring to FIG. 3, in the first direction S, the OCP module 33 has a top 331 and a bottom 332. Furthermore, the server also includes a first liquid level sensor 90 arranged within the first containment chamber 11. The first liquid level sensor 90 has a first sensing end, and is positioned at a height between the top 331 and the bottom 332. During operation, the first liquid level sensor 90 senses the liquid level of the cooling liquid in the first containment chamber 11 in real time. When the liquid level of the cooling liquid in the first containment chamber 11 is below the height of the first sensing end, the liquid supply device is controlled to accelerate the supply of cooling liquid to the first containment chamber 11, so that the cooling liquid can cover the primary heat generation components 30, including the motherboard 31, the GPU modules 32, and the OCP module 33, etc., thereby ensuring the cooling effect of the server.

In an embodiment, referring to FIG. 3, the server also includes a second liquid level sensor 91 arranged within the first containment chamber 11 and positioned higher than the first liquid level sensor 90. The second liquid level sensor 91 has a second sensing end located above all primary heat generation components 30 in the first direction S, and the second sensing end is spaced from the top of the first chassis 10. During operation, the second liquid level sensor 91 senses the liquid level of the cooling liquid in the first containment chamber 11 in real time. When the liquid level of the cooling liquid in the first containment chamber 11 is higher than the second sensing end, it is controlled such that the liquid discharge speed is greater than the liquid inlet speed, avoiding the problem of expansion and deformation of the first chassis 10 due to complete filling of the cooling liquid.

Optionally, the first liquid level sensor 90 and the second liquid level sensor 91 are arranged between the power adapter board 35 and the first end 12.

In an embodiment, referring to FIG. 3, the first liquid inlet 121 and the first liquid outlet 122 are arranged at the second end 13. This configuration prevents the liquid supply device and the CDU from interfering with the second chassis 20 and the cabinet. Additionally, the length of the first main liquid inlet pipe 60 and the first branch liquid inlet pipe 61 between the first liquid inlet 121 and the second liquid inlet 53, and the lengths of the second main liquid inlet pipe 70, the third main liquid inlet pipe 71, the third branch liquid inlet pipe 72, and the fourth branch liquid inlet pipe 73 between the first liquid inlet 121 and the third liquid inlets 5511 are moderate, avoiding cold losses caused by overly long liquid inlet pipes and improving cooling efficiency.

Furthermore, referring to FIG. 3, the first liquid outlet 122 is arranged above the first liquid inlet 121 in the first direction S. Optionally, the first liquid outlet 122 is located at a height position between the height position of one side of the motherboard 31 facing the first liquid level sensor 90 and the height position of the first sensing end of the first liquid level sensor 90. Optionally, the first liquid outlet 122 is located at a height position in the middle of the OCP module 33 in the first direction S. This configuration ensures that the cooling liquid in the first containment chamber 11 can be discharged through the first liquid outlet 122 for heat exchange with an external CDU, and even when the cooling liquid is discharged from the first liquid outlet 122, the cooling liquid remained in the first containment chamber 11 can still cover most of the primary heat generation components 30 such as the motherboard 31 and the GPU modules 32. It thereby meets the cooling needs of the motherboard 31 and GPU module 32, etc., improving the cooling efficiency of the server and ensuring safe operation of the server.

In an embodiment, referring to FIG. 1 and FIG. 3, the first chassis 10 includes a casing 14 and a lid 15. The casing 14 has an opening 141 on one side thereof, and the opening 141 is located between the first end 12 and the second end 13. The lid 15 is detachably arranged at the opening 141. Because the lid 15 is detachably connected to the casing 14, it is convenient to remove the lid 15 for the repairing and maintenance of the primary heat generation components 30.

Furthermore, referring to FIG. 3, a receiving groove 142 is provided on the side of the casing 14 where the opening 141 is located, and a sealing member 16 is arranged within the receiving groove 142. The lid 15 is sealingly engaged with the casing 14 through the sealing member 16. Optionally, the sealing member 16 is a rubber ring. As such, the casing 14 and the lid 15 enclose and form the sealed first chassis 10, which prevents the cooling liquid in the first chassis 10 from leaking out. In addition, by providing the receiving groove 142, the sealing member 16 is restricted within the receiving groove 142, preventing the sealing member 16 from moving and affecting the sealing effect.

Optionally, referring to FIG. 1 and FIG. 3, multiple first fixing holes 143 are provided at the side of the casing 14 where the opening 141 is located. The multiple first fixing holes 143 are arranged along the circumference of the opening 141 at intervals, and all of the multiple first fixing holes 143 are located on the outside of the sealing member 16. The lid 15 has second fixing holes 151 arranged along the circumference of the lid 15 at intervals. Fixing members 17 are provided within the first fixing holes 143 and the second fixing holes 151, respectively. The first fixing holes 143 and the second fixing holes 151 are threaded holes, and the fixing members 17 are screws. As such, the lid 15, the sealing member 16, and the casing 14 are in close contact to ensure the sealing effect of the first chassis 10.

In an embodiment, the server is in a vertical structure, which saves space and optimizes the space layout utilization of a service center.

The above-described server divides the components in the server into primary heat generation components and secondary heat generation components based on the amount of heat generated. Due to the large amount of heat generated, the primary heat generation components are arranged in the first containment chamber. Cooling liquid flows into the first containment chamber through the first liquid inlet, and exchanges heat with the primary heat generation components to decrease the temperatures of the primary heat generation components. The cooling liquid after heat exchange is discharged through the first liquid outlet. As the secondary heat generation components generate less heat and do not require immersion liquid cooling for heat dissipation, they are placed in a second containment chamber, which is sealed and isolated from the first containment chamber. As such, the cooling liquid is provided only in the first containment chamber, ensuring heat dissipation while reducing the amount of cooling liquid used and lowering costs. When the server needs maintenance, the cooling liquid in the first containment chamber can flow out through the first liquid outlet. After all the cooling liquid has flowed out, the server can be maintained, without the need to lift and drain the server, thus avoiding losses due to splashing of the cooling liquid, etc. When the server needs to replace the cooling liquid, the cooling liquid in the first containment chamber flows out through the first liquid outlet. After all the cooling liquid has flowed out, new cooling liquid is injected into the first containment chamber through the first liquid inlet. The cooling liquid replacement process is therefore completed, without the process of lifting all servers, which improves the efficiency of cooling liquid replacement.

In the description of the present disclosure, it is to be noted that if terms such as 'center', 'vertical', 'horizontal', 'length', 'width', 'thickness', 'above', 'below', 'front', 'back', 'left', 'right', 'vertical', 'horizontal', 'top', 'bottom', 'inner', 'outer', 'clockwise', 'counterclockwise', 'axial', 'radial', 'circumferential' are used, the positional relationships indicated by these terms are based on the positional relationships shown in the drawings, solely for the purpose of describing the present disclosure and simplifying the description, and do not imply that the described devices or components must have specific orientations, be constructed and operated in specific orientations, and therefore should not be understood as limiting the present disclosure.

In addition, if the terms 'first' or 'second' are used, these terms are only used to describe the purpose, and should not be understood as indicating or implying relative importance or implying the quantity of the indicated technical features. Therefore, features designated as 'first' or 'second' may explicitly or implicitly include at least one of that feature. In the description of the present disclosure, if the term 'multiple' is used, the meaning of 'multiple' includes at least two, such as two, three, etc., unless otherwise specifically limited.

In the present disclosure, unless otherwise specified and limited, terms such as 'installation', 'connection', 'fixation', etc., should be understood in a broad sense. For example, it can be a fixed connection, a detachable connection, or an integral, it can be a mechanical connection, an electrical connection, it can be a direct connection, or an indirectly connection through an intermediate medium, or it can be internal communication between two components or an interaction relationship between two components, unless otherwise specified. For those skilled in the art, the specific meanings of the above terms in the present disclosure can be understood according to the specific circumstances.

In the present disclosure, unless otherwise specified and limited, if there is an expression that a first feature is 'on' or 'under' a second feature, the meaning can be that the first and second features are in direct contact, or the first and second features are indirectly in contact through an intermediate medium. In addition, the expression that a first feature is 'above', 'upwards', or 'on top' of a second feature can mean that the first feature is directly above or diagonally above the second feature, or simply that the horizontal height of the first feature is higher than the second feature. The expression that a first feature is 'below', 'downwards', or 'underneath' a second feature can mean that the first feature is directly below or diagonally below the second feature, or simply that the horizontal height of the first feature is lower than the second feature.

It should be noted that if a component is described as being 'fixed to' or 'arranged on' another component, it may be directly on the other component or there may also exist an intermediate component. If a component is considered to be 'connected' to another component, it may be directly connected to the other component or there may also exist an intermediate component. If present, the terms 'vertical', 'horizontal', 'top', 'bottom', 'left', 'right', or similar expressions used in the present disclosure are for illustrative purposes only and do not imply exclusive embodiments.

The technical features of the above-mentioned embodiments can be combined arbitrarily. In order to keep the description concise, not all possible combinations of technical features in the above embodiments are described. However, as long as the combination of these technical features is not contradictory, it should be considered within the scope of the present specification.

The above-described embodiments only express several implementations of the present disclosure, which are described in a specific and detailed manner. However, it should not be understood as limiting the scope of the patent application. It should be noted that for those skilled in the art, various modifications and improvements can be made without departing from the concept of the present disclosure, which are all within the scope of protection of the present disclosure. Therefore, the scope of protection of the patent application should be determined by the appended claims.

What is claimed is:

1. A server, comprising:

a first chassis and a primary heat generation component, the first chassis having a first containment chamber containing cooling liquid, the primary heat generation component being arranged within the first containment chamber, the first chassis having a first liquid inlet and a first liquid outlet which are both in communication with the first containment chamber, the first chassis having a first end; and a second chassis and a secondary heat generation component, the second chassis being arranged at the first end and fixedly connected to the first chassis, the second chassis having a second containment chamber, the second containment chamber being sealed and isolated from the first containment chamber, the secondary generation component being arranged in the second containment chamber;

wherein the primary heat generation component comprises a motherboard arranged at a lower part of the first chassis in a first direction, where the first direction is a height direction of the first chassis; and the server further comprises a first liquid cooling module arranged on a surface of the motherboard, the first liquid cooling module having a second liquid inlet and a second liquid outlet in communication with the second liquid inlet, the second liquid inlet being in communication with the first liquid inlet, the second liquid outlet being in communication with the first containment chamber.

2. The server according to claim 1, wherein the motherboard is provided with a CPU, the first liquid cooling module comprises a first cold plate corresponding to a position of the CPU, and the first cold plate includes the second liquid inlet and the second liquid outlet.

3. The server according to claim 1, wherein the primary heat generation component further comprises a GPU module arranged at a lower part of the first chassis in the first direction and located on a side of the motherboard away from the first end.

4. The server according to claim 3, wherein the GPU module has a receiving cavity, the server further comprises a second liquid cooling module, the second liquid cooling module comprises a third cold plate arranged within the receiving cavity, the third cold plate has a third liquid inlet and a third liquid outlet in communication with the third liquid inlet, the third liquid inlet is in communication with the first liquid inlet, the third liquid outlet is in communication with the receiving cavity, and the GPU module further has a fourth liquid outlet in communication with the receiving cavity and the first containment chamber.

5. The server according to claim 4, wherein the server further comprises a liquid divider fixed on the first chassis, the liquid divider has a liquid dividing chamber, a first liquid dividing inlet, a second liquid dividing inlet, and a third liquid dividing inlet, the liquid dividing chamber is in communication with the first liquid dividing inlet, the second liquid dividing inlet and the third liquid dividing inlet, the first liquid dividing inlet is in communication with the first liquid inlet, the second liquid dividing inlet is in communication with the second liquid inlet, and the third liquid dividing inlet is in communication with the third liquid inlet.

6. The server according to claim 5, wherein the server further comprises a first temperature sensor arranged within the liquid divider, and the first temperature sensor is configured to detect a temperature of the cooling liquid in the liquid divider.

7. The server according to claim 4, further comprising an OCP module arranged above the GPU module in the first direction.

8. The server according to claim 7, wherein the OCP module has a top and a bottom in the first direction, the server further comprises a first liquid level sensor arranged in the first containment chamber, the first liquid level sensor has a first sensing end, and the first liquid level sensor is positioned at a height between the top and the bottom of the OCP module.

9. The server according to claim 8, wherein the server further comprises a second liquid level sensor arranged in the first containment chamber, the second liquid level sensor is positioned higher than the first liquid level sensor, the second liquid level sensor has a second sensing end located above the primary heat generation component, and the second sensing end is spaced from a top of the first chassis.

10. The server according to claim 8, wherein the first chassis further has a second end opposite to the first end.

11. The server according to claim 10, wherein the first liquid inlet and the first liquid outlet are arranged at the second end, and the first liquid outlet is arranged above the first liquid inlet in the first direction.

12. The server according to claim 10, wherein the second end is provided with a through hole, the server further comprises an electrical connector mounted on the first chassis, the electrical connector comprises a seat body and a first clamping portion coupled to the seat body, the seat body is arranged within the first containment chamber, and the first clamping portion is arranged outside the second end via the through hole and configured to be electrically connected to a power supply device; and the server further comprises a power supply board and a power supply cable, the power supply board is arranged above the motherboard and electrically connected to the motherboard, one end of the power supply cable is electrically connected to the power supply board, and the other end of the power supply cable is electrically connected to the electrical connector.

13. The server according to claim 12, wherein the power supply board comprises a power converter electrically connected to the power supply cable; and the server further comprises a power adapter plate arranged above the motherboard in the first direction and arranged on a side of the power supply board facing the second end, and the power adapter plate is electrically connected to the power converter and the motherboard.

14. The server according to claim 1, wherein the first chassis further has a second end opposite to the first end, the first chassis comprises a casing and a lid, the casing has an opening on one side thereof, the opening is located between the first end and the second end, the lid is arranged at the opening, the casing has a receiving groove at the side where the opening is located, a sealing member is arranged within the receiving groove, and the lid is sealingly engaged with the casing through the sealing member.

15. The server according to claim 14, wherein the side of the casing where the opening is located has multiple first fixing holes, all of the first fixing holes are arranged along a circumference of the opening at intervals, and all of the first fixing holes are located on the outside of the sealing member; and the lid has second fixing holes, all of the second fixing holes are arranged along a circumference of the lid at intervals, and fixing members are provided within the first fixing holes and the second fixing holes, respectively.

* * * * *